(12) United States Patent
Nakata

(10) Patent No.: US 6,294,822 B1
(45) Date of Patent: Sep. 25, 2001

(54) SPHERIC SEMICONDUCTOR DEVICE, METHOD FOR MANUFACTURING THE SAME, AND SPHERIC SEMICONDUCTOR DEVICE MATERIAL

(76) Inventor: Josuke Nakata, 112-17, Kamiootani, Kuse, Jyoyo-shi Kyoto 610-01 (JP)

(*) Notice: Subject to any disclaimer, the term of this patent is extended or adjusted under 35 U.S.C. 154(b) by 0 days.

(21) Appl. No.: 09/297,207

(22) PCT Filed: Aug. 27, 1997

(86) PCT No.: PCT/JP97/02993

§ 371 Date: Jun. 10, 1999

§ 102(e) Date: Jun. 10, 1999

(87) PCT Pub. No.: WO99/10935

PCT Pub. Date: Mar. 4, 1999

(51) Int. Cl.[7] .................................................. H01L 31/06
(52) U.S. Cl. .................... 257/461; 257/465; 257/431; 257/414; 257/80; 257/81; 257/82; 257/113; 438/48; 438/49; 438/81
(58) Field of Search .................................. 257/461, 465, 257/431, 414, 459, 80, 81, 82, 113; 438/382, 48, 81, 49

(56) References Cited

U.S. PATENT DOCUMENTS

| | | | |
|---|---|---|---|
| 4,617,192 | * 10/1986 | Chin et al. | 427/42 |
| 5,785,768 | * 7/1998 | Nakata | 136/250 |
| 6,204,545 | * 3/2001 | Nakata | 257/459 |

FOREIGN PATENT DOCUMENTS

| | | |
|---|---|---|
| 59-121886 | 7/1984 | (JP) . |
| 61-220482 | 9/1986 | (JP) . |
| 62-30373 | 2/1987 | (JP) . |
| 63-200577 | 8/1988 | (JP) . |
| 3-008455 | 1/1991 | (JP) . |
| 3-227577 | 10/1991 | (JP) . |
| 4-207087 | 7/1992 | (JP) . |
| 8-125210 | 5/1996 | (JP) . |

OTHER PUBLICATIONS

S. Wolf, Silicon Processing for the VLSI Era vols. 1, 2 and 3, Lattice Press, Jan. 1990.*

* cited by examiner

Primary Examiner—Matthew Smith
Assistant Examiner—Belur V Keshavan
(74) Attorney, Agent, or Firm—Morrison Law Firm

(57) ABSTRACT

The present invention discloses a small spherical solar cell SS (spherical semiconductor) and the manufacturing method for the same, comprising: a spherical core 1; a reflective film 2 formed on the surface of core 1; a semiconductor thin film layer (p type polycrystalline silicon thin film 4a, n+ diffusion layer 7) which is approximately spherical and is formed on the surface of reflective film 2; a n+p junction 8 which is formed on semiconductor thin film layer; passivation film 9; and a surface protective film 10 of titanium dioxide; a pair of electrodes 11a, 11b connected to both sides of n+p junction 8. Other than spherical solar cell SS, the following are also disclosed: a spherical crystal manufacturing device; 2 types of spherical solar cells; 2 types of spherical photocatalytic elements; a spherical light emitting element which emits visible blue light; 2 types of spherical semiconductor device materials.

25 Claims, 11 Drawing Sheets

SPHERIC SEMICONDUCTOR DEVICE, METHOD FOR MANUFACTURING THE SAME, AND SPHERIC SEMICONDUCTOR DEVICE MATERIAL

BACKGROUND OF THE INVENTION

The present invention relates to a spherical semiconductor device and the manufacture method for the same. The spherical semiconductor device can be applied to various uses as a photo micro solar cell, detecting element, light emitting element or as a photocatalytic element. The spherical semiconductor device comprises a semiconductor thin film layer on the surface of a small spherical core made of a semiconductor material, insulating material or metallic material, and has at least one pair of electrodes. The present invention also relates to a spherical semiconductor device material.

Various solar cells in which a semiconductor converts solar energy into electrical energy are widely used. With these solar cells, the semiconductor substrate is planar. The light-receiving surface as well as the pn-junction which is formed in its interior are also largely formed as a flat surface. The electrodes as a mechanical support are provided on the substrate side. As a result, the light-receiving surface is limited to the front surface, and photoelectric conversion from the backside is not possible. Furthermore, as the angle of incidence of the light becomes larger, light reflection increases, and the photoelectric conversion efficiency is reduced.

The semiconductor photocatalyst generates a photovoltage when it receives solar light and causes an electrochemical reaction by this photovoltage. Metal oxide semiconductors such as titanium dioxide ($TiO_2$), strontium titanate ($SrTiO_3$), or the like have been utilized as the semiconductor photocatalyst. Photocatalysts in which a metal such as platinum or the like is supported on a powder of metal oxide semiconductor have been researched. Electrodes formed by a thin layer of titanium dioxide on one side of titanium plate have also been researched. Because metal oxide semiconductors such as titanium dioxide or the like have a large energy band gap, electrolysis of water is possible, and they do not dissolve in an electrolytic solution. However, titanium dioxide does not function as a photocatalyst when the light spectrum has a wavelength of approximately 410 nm or greater. As a result, the photoelectric conversion efficiency with respect to sunlight is low.

In U.S. Pat. No. 4,021,323, there is described a technology, wherein: small amounts of molten silicon melt are sprayed from a small nozzle which is placed on the upper end of a shot tower; silicon melt is allowed to free fall, and spherical crystals of silicon are created. However with this technology, impurities from the nozzle may become dissolved into the molten silicon. Furthermore, because there is a volume increase when molten silicon solidifies, and because solidification begins from the surface, the part which solidifies last will protrude towards the surface of the spherical crystal, and a protruding area is formed. A truly spherical sphere crystal can not be formed. However, with the drop tube type experimental apparatus of NASA, because it is equipped with an electromagnetic levitation heating equipment, the material is allowed to melt without crucible and free fall.

In this U.S. Patent, a pn junction which can conduct photoelectric conversion is formed on the spherical crystal of silicon. There is also disclosed a solar cell array where a plurality of these spherical crystals (micro photocells) are lined up and connected to a common metal electrode film. There is also disclosed a photochemical energy conversion device wherein: these solar cell arrays are submerged in electrolyte solution; and electrolysis of a solution of hydroiodic acid and hydrobromic acid proceeds by the photovoltage provided by the photoelectric conversion of sunlight.

However, because each of the spherical crystals are attached to the metal electrode film which is the common electrode, incident light can only be received from the front surface side. Because a plurality of micro photocells share the metal electrode film, each individual micro photocells can not be used as independent solar cell elements. As a result, the micro photocells can not be dispersed in the electrolyte solution, their installation positions can not be changed, nor can they be recovered and reused or washed. The limitations in its use as a semiconductor photocatalyst are extremely large. In addition, in this USP, there is no disclosure regarding the use of semiconductors with photocatalytic function as electrodes for the micro photocells, nor is there disclosure regarding the use of semiconductors which have photocatalytic function and which are selected by considering the reaction activity or reaction selectivity. In the art of this US patent, each of the microphotocells described above do not have their own pair of electrodes. A single or a plurality of spherical semiconductor elements having a pn junction can not be incorporated into a semiconductor device in such a way that they are independent cells or elements. Because the mode of electrical connection of the plurality of spherical semiconductor elements is fixed, it lacks in generalizability and is not practical.

In a previous international patent application (PCT/JP 96/02948), the present inventors have proposed a new spherical semiconductor device which can be used variously as a light detecting element (photoelectric conversion element), light emitting element (electrophoto conversion element), or photocatalytic element. This spherical semiconductor device is basically a spherical crystal of semiconductor with a pn junction (or a MIS configuration, Schottky barrier) and a pair of electrodes. For the photocatalytic device, an electrode coating of a oxide semiconductor which has a photocatalytic function is formed on one electrode. In the previous international patent application, the following devices are proposed: a device where the spherical semiconductor device is used alone; a device where a plurality of spherical semiconductor devices are connected in series; a device where a plurality of spherical semiconductor devices are placed in a matrix; an electrolysis device where a plurality of spherical semiconductor devices are scattered in an electrolyte solution.

In the present invention, we propose a spherical semiconductor device and the manufacturing method for the same in which the spherical semiconductor device proposed in the previous international patent application is improved.

OBJECTS AND SUMMARY OF THE INVENTION

The basic object of the present invention is to provide a new construction for a spherical semiconductor device and a manufacturing method for the same which can be used variously as a light-receiving element, light-emitting element, or a photocatalytic element. A further object of the present invention is to provide a spherical semiconductor device which is appropriate for making a solar cell which has excellent performance and high durability. A further object of the present invention is to manufacture this device with as small amount of semiconductor material as possible. A further object of the present invention is to improve the mechanical strength and chemical stability of the surface of this device as well as making the surface less easily contaminated. A further object of the present invention is to heighten the output power, photoelectric conversion efficiency, generalizability and practicality.

The present invention is a spherical semiconductor device, comprising: a spherical core; a semiconductor thin film layer which is approximately spherical and is formed either on the surface of the core or near the outer side of the core; at least one pn junction formed on this semiconductor thin film layer; a pair of electrodes connected to both sides of this pn junction.

The core is constructed from a semiconductor material such as silicon or the like, or an insulating material, or a metal material. The semiconductor material used for the core can be a semiconductor of lower quality than the semiconductor which constructs the semiconductor thin film layer and can be a metallurgical silicon. Metal material used for the core is preferably a metal material which has a thermal expansion coefficient close to the thermal expansion coefficient of the semiconductor thin film layer. The insulating material used for the core is preferably an insulating material (preferably transparent) with a thermal expansion coefficient close to the thermal expansion coefficient of the semiconductor thin film layer. Because the core does not need to be constructed from a high grade semiconductor material, the usage amount of high grade semiconductor material is reduced, and material costs can be greatly reduced. This becomes advantageous for manufacturing.

The thin semiconductor film layer can be constructed from Si or SiGe alloyed crystal semiconductor, or a III–V group compound semiconductor such as GaAs or InP or the like, or a chalcopearlite semiconductor such as $CuInSe_2$. When the pn junction has a photoelectric conversion function wherein incident light coming from the outside is absorbed and photovoltage is generated, the semiconductor device can be a solar cell or a light detecting element. Furthermore, when the pn-junction has a electrophoto conversion function wherein an electrical current supplied from a pair of external electrodes is converted to light and is emitted to the outside, the semiconductor device can be a light-emitting element.

An individual spherical semiconductor device can be a light detecting element or a light emitting element. If a plurality of spherical semiconductor devices are connected in series, it becomes an arrayed light detecting device or light emitting device. If a plurality of spherical semiconductor devices are arranged in a matrix, it becomes a sheet light detecting device or light emitting device. For example, by using a sheet color emitting device in which a plurality of red light emitting elements, green light emitting elements, and blue light emitting elements are arranged in a matrix, a color display can be constructed.

With this spherical semiconductor device, except for the pair of electrodes, light can be received from all directions on the sphere surface, and light can be emitted from all directions on the sphere surface. When using the spherical semiconductor device as a solar cell sheet, even if the angle of incidence of the sunlight changes, the rate of reflection does not increase, and as a result, the photoelectric conversion efficiency is heightened. With this solar cell sheet, because a portion of the light is also transmitted, it can also act as window glass.

Spherical semiconductor devices, which have a photoelectric conversion function wherein a coating (for example a coating of titanium dioxide) which has a photocatalytic function covers at least the surface of one of the electrodes, can be a particulate photocatalytic element. This photocatalytic element can be used in the electrolysis by light energy of various electrolyte solutions. In this case, a plurality of photocatalytic elements can be scattered and placed in the bottom of an electrolyte solution chamber, and light is shined. Depending on the electrolytic potential, photocatalytic elements can be connected serially several at a time in order to generate the required photovoltage.

In order to improve the performance of the spherical semiconductor devices described above, the following constructions can also be added.

For the spherical semiconductor as the light detecting element, a passivation film which confines carriers is formed on at least one surface of either the inner surface or outer surface of the semiconductor thin film layer where photovoltage is generated. This results in an increased photovoltage. A reflective surface which has slight irregularities can be positioned on the interior of the semiconductor thin film layer and positioned either on the surface of or near the outside of the core. Transmitted light which passes through the semiconductor thin film layer or radiated light generated from the semiconductor thin film layer is reflected by the reflective surface. This results in an increased light-receiving efficiency or light-emitting efficiency. Excluding the surface of the pair of electrodes, a transparent, insulating film can be formed on the outermost surface. This transparent insulating film also acts as a anti-reflective film which prevents the reflection of outside light. When a film of titanium dioxide which has a photocatalytic function is formed as the insulating/anti-reflective film, not only is the mechanical strength and chemical stability of the outer surface of the spherical semiconductor device improved, but it also makes contamination more difficult. Substances which adhere to the outer surface of the spherical semiconductor device is electrolyzed by the photocatalytic action of the titanium dioxide, and as a result, surface contamination is easier to prevent. The reduction in performance of the spherical semiconductor device due to contamination of the outer surface is virtually eliminated.

The manufacturing method for the spherical semiconductor device of the present invention is a 4 step process, wherein: in the first step, a spherical core is created using core material selected the group consisting of: semiconductor material, insulating material or metal material; in the second step, a semiconductor thin film layer is formed in approximately a spherical surface shape on the surface of the core or near the outside of the core; in the third step, at least one pn junction is formed on the semiconductor thin film layer; in the fourth step, a pair of electrodes which is connected to both sides of the pn junction is formed.

In the first step, core material is heated and melted while being levitated by a levitating means. This melt is dropped inside a drop tube and allowed to solidify to become a spherical core. In this situation, the mixing of impurities is prevented, and a truly spherical core can be created by allowing the material to solidify while it maintains a true sphere shape due to the action of surface tension in the absence of the influence of gravity. However, the core can also be made spherical by polishing or etching the core material by mechanical, chemical or electrical means.

Afterwards, when the semiconductor thin film layer, the pn junction, the pair of electrodes, and the like are formed on the core, a spherical semiconductor device which is truly spherical can be created. If the core is a true sphere, it gives a spherical symmetry to the semiconductor thin film layer, and the performance of the semiconductor thin film layer and pn junction can be improved.

In the second step, it is preferred that at least a portion of the processing for the formation of the semiconductor thin film layer be conducted while levitating the processing object, which includes the core, by an electromagnetic or a static electricity levitating means. In this situation, an uniform semiconductor thin film can be formed.

After the second step and before the third step, the small spherical body which includes the core and the semiconductor thin film layer can have the heating and dropping step repeated. This involves heating and melting by an electromagnetic levitation heating means, and dropping the melt inside a drop tube. In this situation, the semiconductor thin film layer can be crystallized to a monocrystal or polycrystal. In the first step, core material made of a monocrystal of a semiconductor or sapphire or the like is used. In the reheating and dropping step described above, the semiconductor thin film layer can be monocrystallized using the core as the seed for crystal growth.

After the second step and before the third step, a coating formation step and a repeating of the heating and dropping steps can be conducted. The coating formation step forms an inorganic, heat-resistant, insulating coating on the surface of the semiconductor thin film layer. In the reheating and dropping steps, the small spherical body which includes the core and semiconductor thin film layer are heated and melted by an electromagnetic levitation heating means, and the molten semiconductor thin film is allowed to solidify while falling inside a drop tube. In this case, since the semiconductor thin film layer is covered with an inorganic, heat-resistant coating film, when it is heated and melted and then solidified, the mixing of impurities into the semiconductor thin film layer is prevented, and irregularities in the thickness of the semiconductor are also prevented.

After the third step and before the fourth step, an insulating film formation step can be conducted. In this step an insulating film of titanium dioxide is formed so that it is positioned on the outermost surface of the spherical semiconductor device. In this situation, an insulating film of titanium dioxide, which has excellent mechanical strength and chemical stability and has photocatalytic function, can be formed on the outer most surface of the spherical semiconductor device.

Furthermore, all of or a portion of the processing after the semiconductor thin film formation, including pn junction formation, electrode formation, surface protection film formation or the like, can be conducted while having the object levitated by an electromagnetic or static electricity levitation means.

The spherical semiconductor device material of the present invention comprises: a spherical core; a semiconductor thin film layer formed approximately spherically on the surface of or near the outer side of the core. The spherical semiconductor device material is used as material for various spherical semiconductor devices. The core is preferably constructed from one of the following materials: a semiconductor with properties different from the semiconductor which constructs the semiconductor thin film layer (same type of metal semiconductor, lower quality semiconductor, different type of semiconductor, or the like); transparent insulating material; or metal material.

BRIEF DESCRIPTION OF THE DRAWINGS

Referring to FIG. 1, there is shown a cross-section of a spherical body which has a reflective film on a spherical core. Referring to FIG. 2, there is shown a cross-section of a spherical body which is the spherical body of FIG. 1 with openings in the reflective film. Referring to FIG. 3, there is shown a cross-section of a spherical body which is the spherical body of FIG. 2 with a p type polycrystalline silicon thin film formed on its surface. Referring to FIG. 4, there is shown a cross-section of the spherical body of FIG. 3 with a silicon dioxide film on its surface. Referring to FIG. 5, there is shown a cross-section of the spherical body of FIG. 4 in which the p type polycrystal silicon thin layer is converted to a p type recrystallization silicon layer. Referring to FIG. 6, there is shown a cross-section of a spherical body of FIG. 5 in which a portion of the spherical body is masked and an n+diffusion layer is formed on the spherical body. Referring to FIG. 6, there is shown a cross-section of a spherical body of FIG. 6 in which a passivation layer is formed on its surface. Referring to FIG. 8, there is shown a cross-section of the spherical body of FIG. 7 in which a surface protective film is formed on the spherical body. Referring to FIG. 9, there is shown a cross-section of the spherical body of FIG. 8 in which openings for electrodes are formed on the spherical body. Referring to FIG. 10, there is shown a cross-section of a spherical solar cell. Referring to FIG. 11, there is shown a partial expanded cross-section of the spherical solar cell of FIG. 10. Referring to FIG. 12, there is shown a block diagram of a spherical crystal manufacturing device. Referring to FIG. 13(a), there is shown the temperature distribution of the melt immediately after melting. Referring to FIG. 13(b), there is shown the temperature distribution of the melt after initiation of dropping. Referring to FIG. 13(c), there is shown the temperature distribution of the melt immediately after heating with an infrared heater. Referring to FIG. 13(d), there is shown the temperature distribution of the melt immediately before initiation of solidification.

DETAILED DESCRIPTION OF THE INVENTION

Referring to the figures, the best modes for carrying out the present inventions will be described below.

Embodiment 1 (Refer to FIGS. 1–13)

Referring to FIGS. 1–10, the method for manufacture of the spherical semiconductor device, spherical solar cell SS, and its construction are described.

Figure 1:
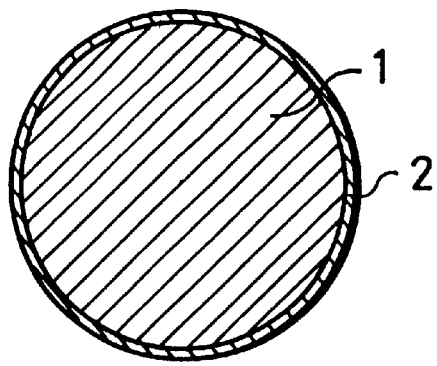
Referring to FIGS. 1–13, there are shown figures relating to embodiment 1 of the present invention.

Referring to FIG. 1, in the first step, a spherical core 1 of metallurgical silicon and a reflective film 2 on its surface are formed. For the core material of core 1, metallurgical silicon (a polycrystalline silicon with a 99% purity) is used. Metallurgical silicon is significantly less expensive and does not require as much energy for manufacturing as semiconductor grade silicon, which requires extreme purification through chemical refining.

Figure 12:
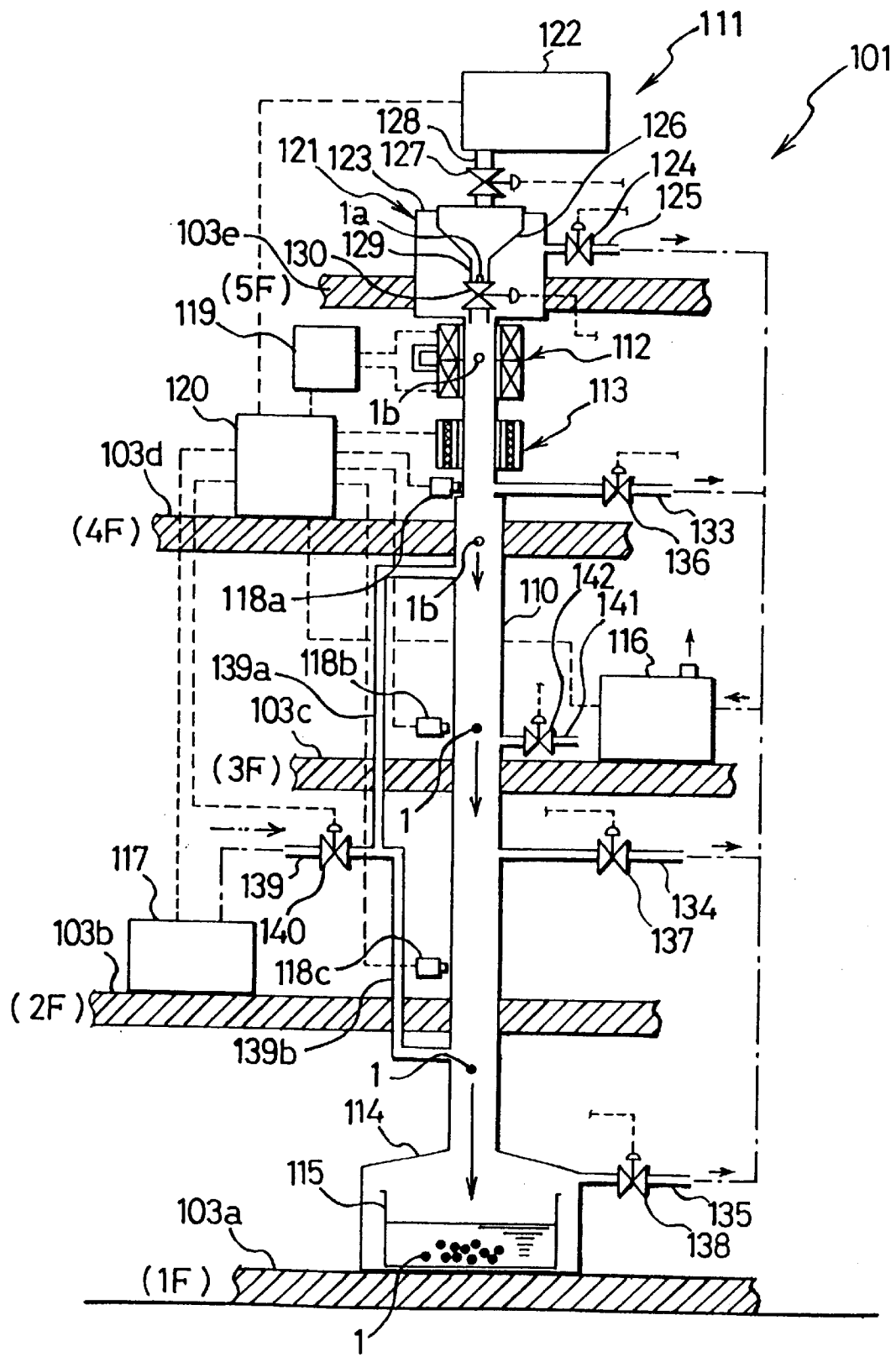
Figure 13:
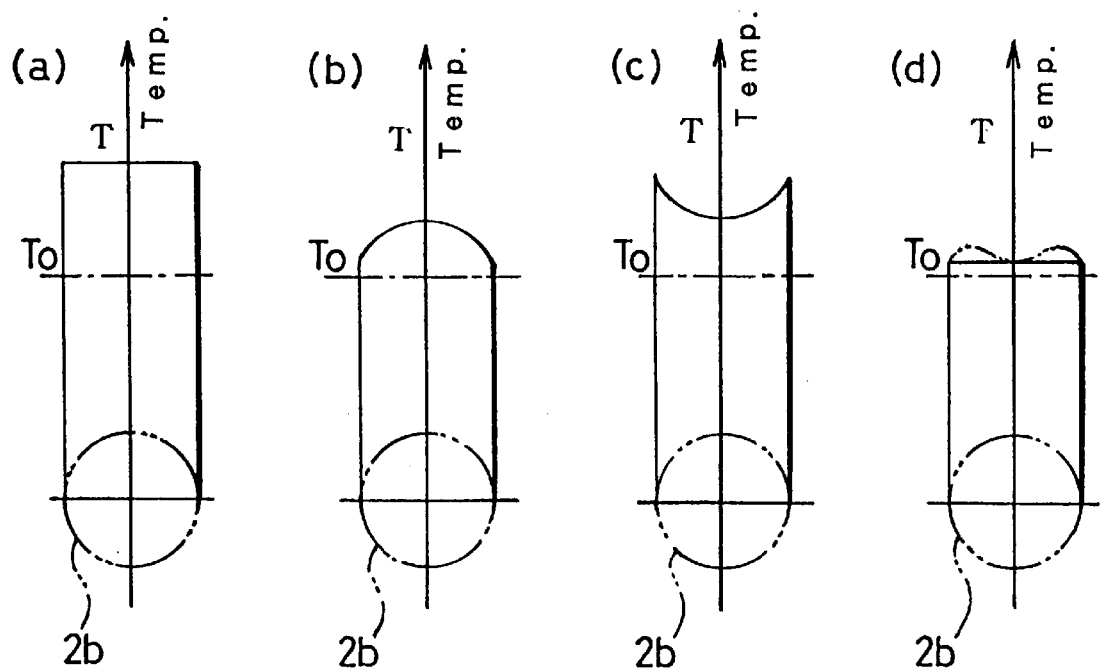

The diameter of core 1 can be selected depending on the use of spherical solar cell SS. The diameter of core 1 in the present embodiment is approximately 2.5 mm. However, the present invention is not limited to this diameter, and it can have a larger diameter or a smaller diameter. When manufacturing spherical core 1, a small particle of core material is melted while it is levitated. It is allowed to solidify under microgravitational conditions through free fall in a vacuum. By this method, impurities from the container are not mixed, and a spherical crystal core 1 can be created easily. For example, at the top of a vacuum drop tube, a particle of core material of metallurgical silicon is heated while being levitated by a high frequency electromagnetic levitation heating equipment. The particle is melted to a silicon liquid droplet. The lifting force is removed, and the droplet is allowed to free fall inside the drop tube, where the silicon droplet becomes spherical due to the action of surface tension under microgravitational conditions, and it solidifies. In this situation, a portion of the impurities in the core material evaporate in the vacuum, and the purity of silicon is increased. The loss of material is less compared to when a sphere is manufactured by mechanical polishing. Referring to FIGS. 12, 13, an example of a spherical crystal manufacturing device, comprising the high frequency electromagnetic levitation heating equipment and the drop tube, will be described later.

Regarding core 1 of solidified metallurgical silicon, due to a segregation effect, impurities tend to aggregate at its surface. Impurities are removed by etching the surface of core 1 by 1–3 micrometers with an aqueous solution of potassium hydroxide (KOH). By further reactive ion etching, minute irregularities with elevation differences of around 1 micrometer are formed on the surface of core 1. Reflective film 2 is formed on the surface of these irregularities. A reflective surface 2a (refer to FIG. 11) with minute irregularities is formed on the surface of reflective film 2. Because the small irregularities on core 1 and reflective film 2 can not be depicted, they are omitted in the drawing. Reflective film 2 comprises 2 coatings. When reflective film 2 is being formed, a silicon dioxide film ($SiO_2$) with a thickness of 0.3–0.4 micrometers is formed on the surface of core 1. Next, a silicon nitride film ($Si_3N_4$) of thickness 0.25–0.35 micrometers is formed on the surface of the silicon dioxide film. These coatings can be formed by various known methods. For example, they can be formed by low pressure CVD method. The reflective film 2, comprising these two insulating coatings, reflect and disperse incident light. It also prevents impurities contained in core 1 from diffusing and being mixed with the high purity silicon of semiconductor thin film layer which is formed on top of reflective film 2. The minute irregularities of reflective surface 2a on the surface of reflective film 2 is for reflecting and scattering the incident light.

Figure 2:
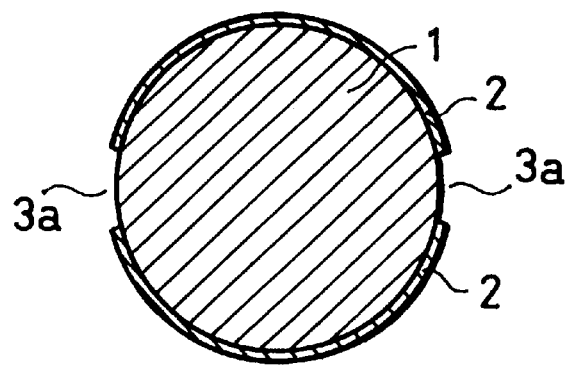

Next, referring to FIG. 2, in the second step, openings 3a, 3b of diameter of approximately 100 micrometers are formed on reflective film 2 by etching. They are formed at two positions which are symmetric with respect to the center of core 1. A portion of core 1 is exposed.

Figure 3:
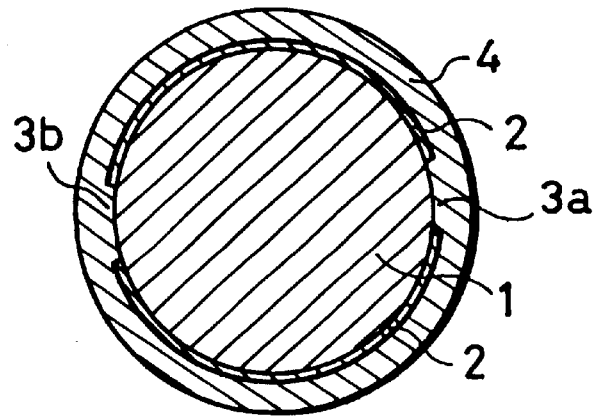

Next, referring to FIG. 3, in the third step, a p type polycrystalline silicon thin film 4 of approximate thickness 10 micrometers is formed over the entire surface of the spherical body comprising core 1 and reflective film 2. High purity silicon thin film 4 is an electrical energy generating layer. The film can be formed by the known method of low pressure CVD method, for example. Thin film 4 can be formed through the thermal decomposition of monosilane ($SiH_4$).

Figure 4:
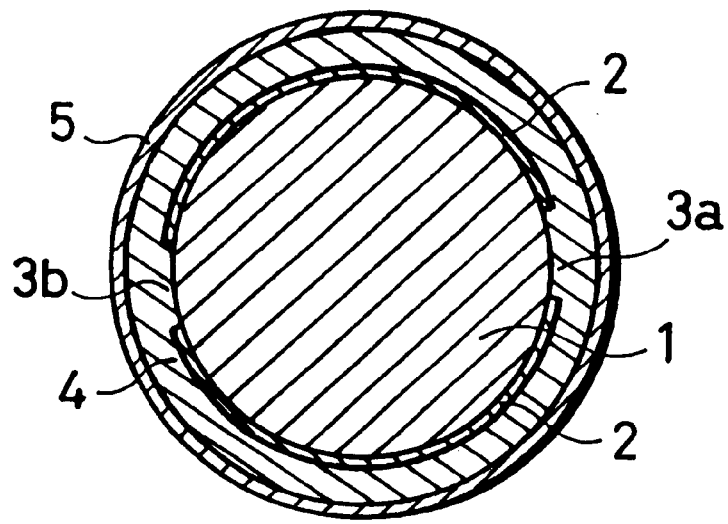

Next, referring to FIG. 4, in the fourth step, a silicon dioxide film 5 ($SiO_2$ film) with an approximate thickness of 0.5 micrometer can be formed over the entire surface of p type polycrystalline silicon thin film 4. It can be formed by low pressure CVD method, for example. The entire surface of p-type polycrystalline thin film 4 is capped.

Figure 5:
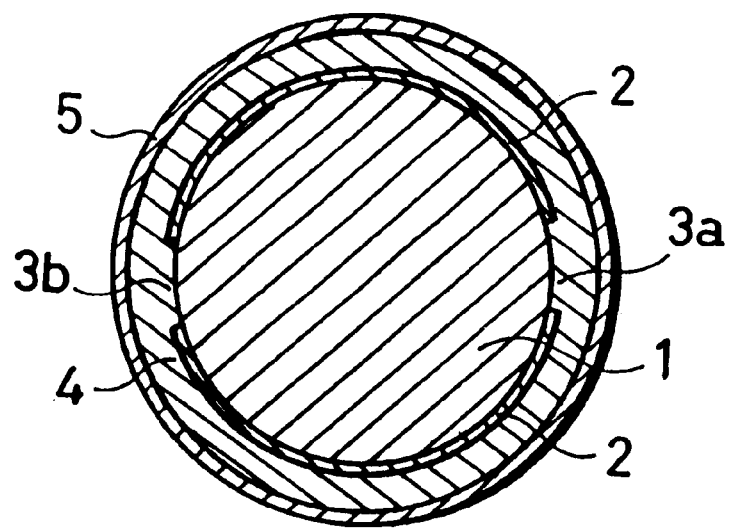

Next, referring to FIG. 5, in the fifth step, in order to reform p-type polycrystalline thin film 4 into a polycrystal or a monocrystal with a bigger crystal grain size, p-type polycrystalline thin film 4 is heated and melted. Using core 1 as a seed, it is recrystallized into a polycrystalline or monocrystalline p-type recrystallized silicon layer 4a.

As a method for recrystallization, a spherical crystal manufacturing device similar to one used for making spherical core 1 is used. While the spherical body (sample) is levitated in a vacuum, p-type polycrystalline silicon thin film 4 is rapidly heated. The outer surface of p-type polycrystalline silicon thin film 4 is flash melted. The melt is recrystallized. With this method, reflective film 2 functions as an insulating film. High frequency induced current flows easily through p-type polycrystalline silicon thin film 4, and silicon thin film 4 is rapidly melted. The solidification of polycrystalline silicon thin film 4 starts from openings 3a, 3b where it is in contact with core 1 which has a better heat flow and a more rapid decrease in temperature compared with the surface of reflective film 2 which has a low rate of heat conduction. Silicon core 1 of openings 3a, 3b act as the seed for crystal growth. A large grain size polycrystal or monocrystal of p type recrystallization silicon layer 4a grows in all directions along the surface of the sphere. Silicon dioxide film 5, which is the cap, prevents irregularities in the thickness of p-type recrystallization silicon layer 4a. Silicon dioxide film 5 also prevents reactions with the outer side and prevents the evaporation to the outside of impurities which have been doped.

Figure 6:
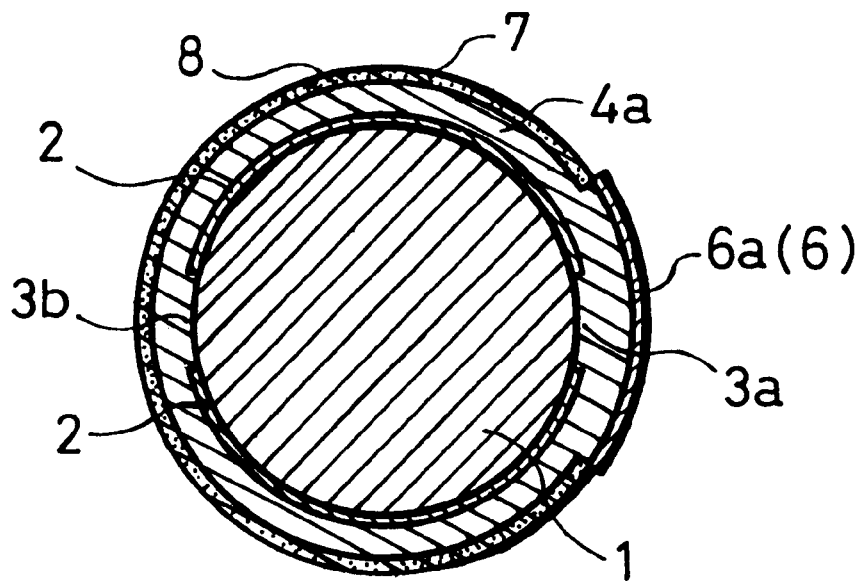

Next, in the sixth step, after removing silicon dioxide film 5 from the surface of the spherical body by etching, a silicon dioxide film 6 ($SiO_2$ film) of approximate thickness 0.5 micrometer is again formed by known methods of thermal oxidation method or low pressure CVD method. Referring to FIG. 6, in order to form a pn junction at the specified surface portion of p type recrystallization silicon layer 4a, a large proportion of silicon dioxide film 6 is etched and removed. Only the portion of silicon dioxide film 6 which is masked by diffusion mask 6a, approximately 500 micrometer diameter, remains.

Next, in the seventh step, except for the area masked by diffusion mask 6a, phosphorus as the n type impurity is diffused in p type recrystallization silicon layer 4a by a thermal diffusion method. Referring to FIG. 6, except for the area covered by diffusion mask 6a, by the diffusion of phosphorus, an n+ diffusion layer 7 of depth 0.3–0.5 micrometer is formed on p type recrystallization silicon layer 4a. An approximately sphere shaped n+p junction 8 is formed at the interface with p type recrystallization silicon layer 4a. N+p junction 8 is necessary for generation of photovoltage.

Figure 7:
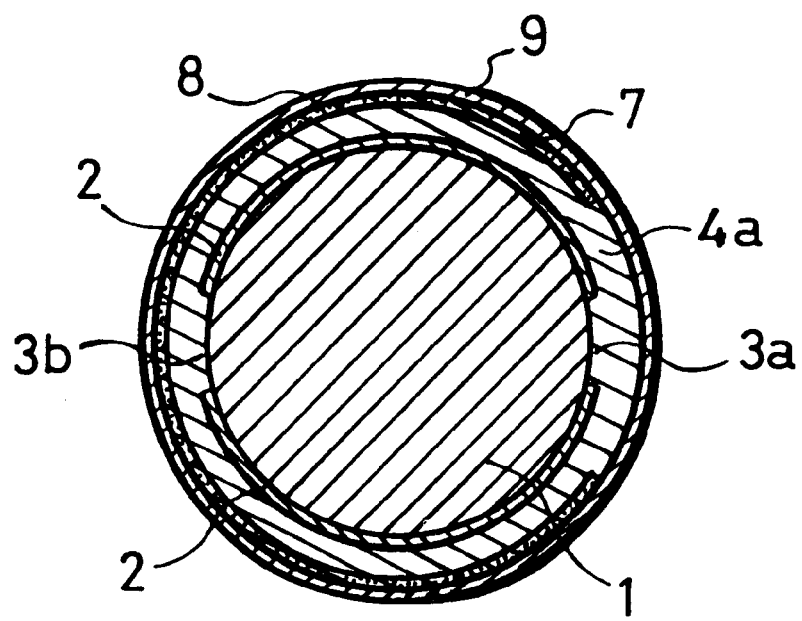

Next, in the eighth step, silicon dioxide film ($SiO_2$), which is formed when phosphorus diffusion process is carried out, and diffusion mask 6a are completely removed by etching. Referring to FIG. 7, a passivation film 9 of silicon dioxide film with an approximate thickness of 0.2 micrometer is formed over the entire surface of the spherical body by the known method of low pressure CVD method. Passivation film 9 reduces the recombination velocity of a minority of carriers which have been photo-generated at the interface with silicon. The proportion of photo-generated carriers which contribute to the photoelectric conversion is increased.

Figure 8:
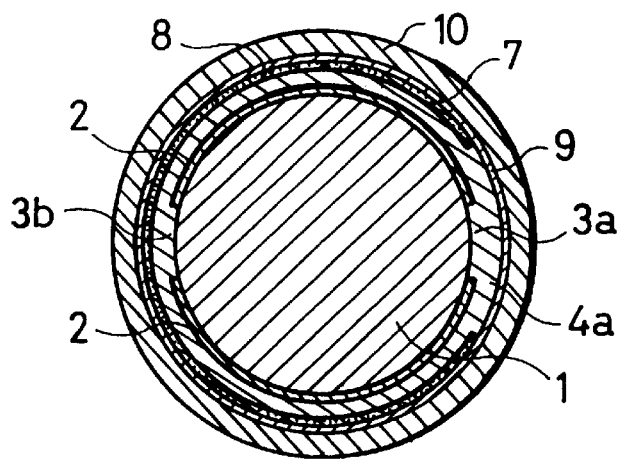

Next, referring to FIG. 8, in the ninth step, a transparent surface protective film 10 covers the surface of passivation film 9. Together with passivation film 9, surface protective film 10 prevents reflection of outside light, is extremely anti-corrosive, and has a high hardness and is difficult to damage. A coating of titanium dioxide ($TiO_2$) is preferable as surface protective film 10. For the purpose of surface protection, the thickness of surface protective film 10 is preferably in the range of 1–2 micrometer. The thickness is determined such that it will have an anti-reflective effect with respect to wavelengths which are the target for maximizing photoelectric conversion.

As is well known, titanium dioxide ($TiO_2$) has photocatalytic function. When short wavelength light of wavelength of approximately 420 nm or lower is absorbed, gas or liquids contacting the surface is electrolyzed by photovoltage. As a result the surface is less likely to become clouded or contaminated. This is ideal for the light receiving surface of spherical solar cell SS. For the method of forming surface protective film 10 of titanium dioxide, sol gel titanium dioxide can be made to be adhere by spraying or dipping, and at 800–1000 degrees C., the film is burned on.

Figure 9:
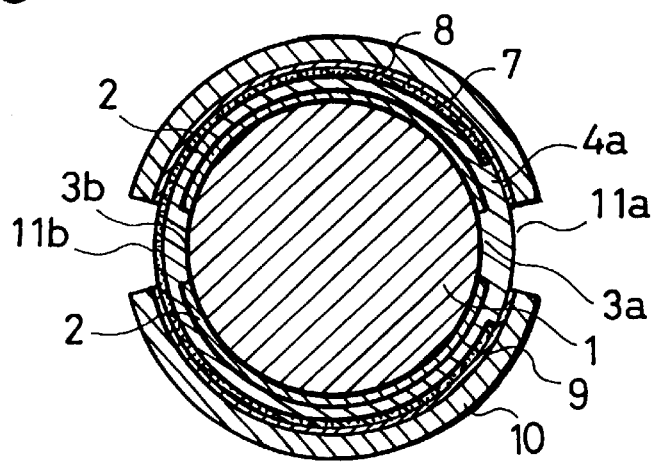

Next, referring to FIG. 9, in the tenth step, a pair of openings 11a, 11b of diameter approximately 300 micrometer is formed so that their centers match with openings 3a, 3b. Openings 11a, 11b are formed by selective sand blast method or reactive ion etching method. Openings 11a, 11b pass through surface protective film 10 and passivation film 9.

Figure 10:
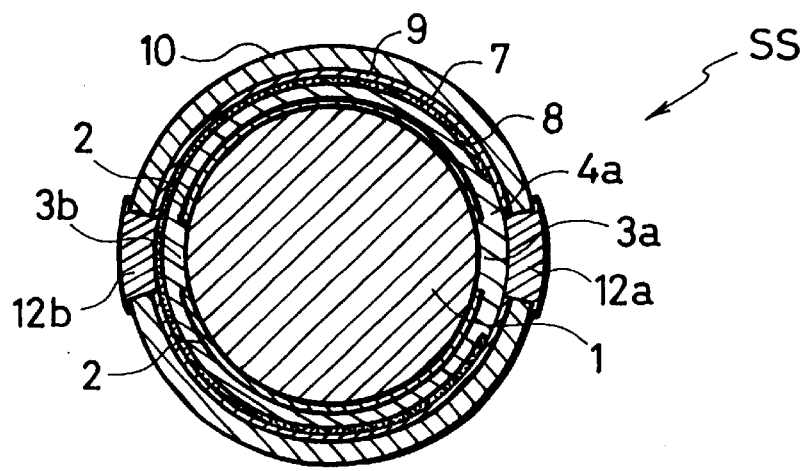

Next, referring to FIG. 10, in the eleventh step, anode electrode 12a and cathode electrode 12b which conduct current to the outside are formed. Anode electrode 12a and cathode electrode 12b are connected to the exposed surfaces of p type recrystallization silicon layer 4a and n+ diffusion layer 7 at openings 11a, 11b. As a method for forming electrodes 12a, 12b, electroless plating of metal constructed from a palladium film of thickness 50 nm and a nickel film of 3 micrometer is conducted. They are formed by heat treatment at approximately 400 degrees C. so as to obtain good ohmic contact. Spherical solar SS is manufactured in this manner, Next, the actions and advantages of the spherical solar cell SS described above will be explained.

Figure 11:
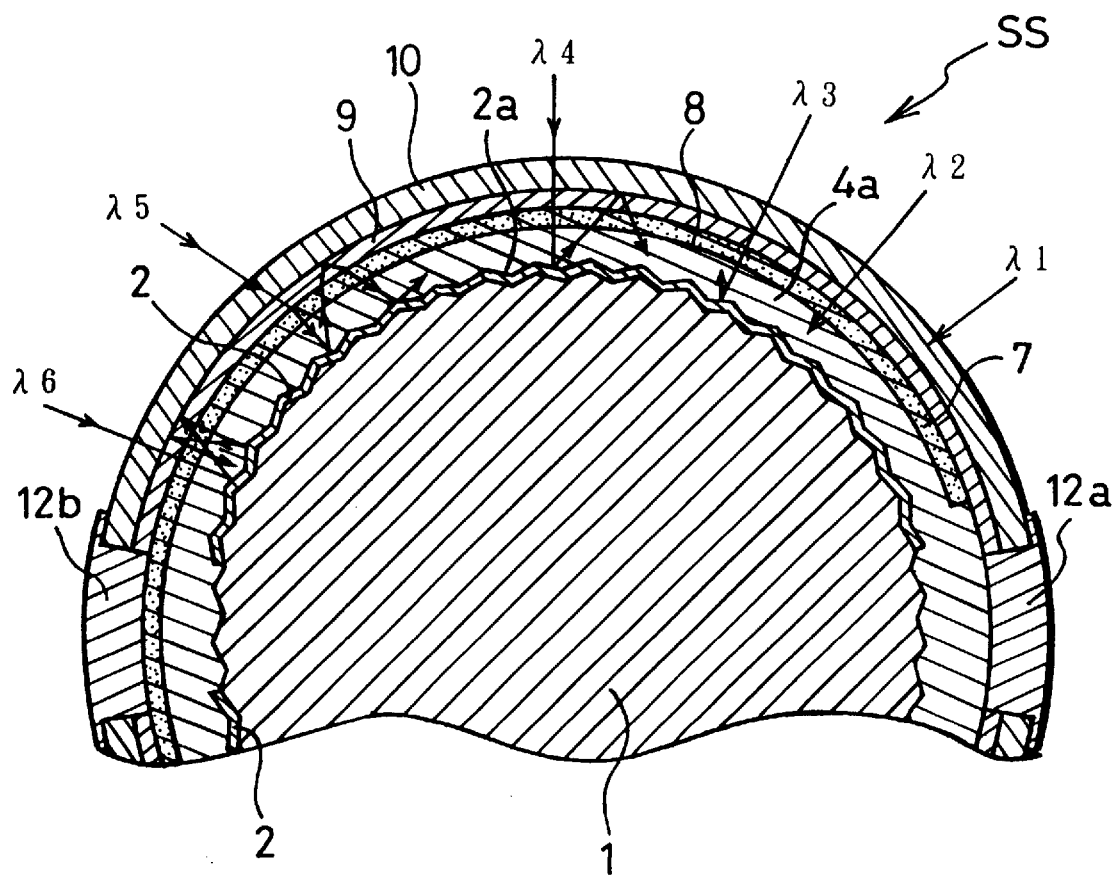

Referring to FIG. 11, there is shown a partial expansion of spherical solar cell SS of FIG. 10. Because a large proportion of the sphere surface of spherical solar cell SS is pn junction 8 (in the previous embodiment n+p junction 8) where photovoltage is generated, a large proportion of the light, which either reaches the sphere surface directly, or is reflected light or is scattered light, are absorbed and converted to electricity.

Referring to FIG. 11, when sunlight is incident on the surface of spherical solar cell SS, light with a wavelength of approximately 420 nm or lower (wavelength lambda 1) is absorbed by the $TiO_2$ film which is surface protective film 10. Within the $TiO_2$ film, electrons and positive holes are excited. On the surface, due to the action of excited positive holes, organic materials and water or electrolyte solution and gas or the like are oxidized and decomposed. Contamination is reduced, and the surface is not easily clouded. Light with wavelengths of approximately 420 nm or greater (wavelengths lambda 2–lambda 6), passes through surface protective film 10 and passivation film 9. Shorter wavelength light is absorbed between n+ diffusion layer 7 and p type recrystallization silicon layer 4a. Referring to FIG. 11, longer wavelength light (wavelengths lambda 3–lambda 6) which has not been absorbed is reflected and scattered by reflective surface 2a of reflective film 2. It is returned to p type recrystallization silicon layer 4a and absorbed. Even if the wavelength is large, by repeated reflections between the inner side and outer side of the insulating film (2, 9 and 10), a large proportion of the light which can be absorbed by silicon is absorbed inside silicon semiconductor thin film. As a result, electron and positive hole pairs are generated by n+p junction 8. Due to the electric field in n+p junction 8, electrons flow to cathode electrode 12b, and positive holes flow towards anode electrode 12a. The photovoltage which is in response to this internal electric field appears at electrodes 12a, 12b. An electrical current which is proportional to the absorbed photon flux density flows through the outside circuit which is connected to electrodes 12a, 12b.

The electricity generating layer, comprising thin film silicon, comprising semiconductor thin film layer (4a, 7), has a construction, wherein it is sandwiched between reflective film 2, comprising a two layer insulating film with an irregular surface which has a lower index of refraction than silicon and an outer side insulating film of passivation film 9 and surface protective film 10. Light shined from the outside is confined between both insulating films (2, 9 and 10). As a result, a thick silicon layer of high purity is not needed. Furthermore, by making the electricity generating layer into a thin film, and by making passivation film 9 and reflective film 2 have a construction which will reduce the rate of recombination at the interface, carriers which are generated by light are confined inside the semiconductor thin film layer, and this contributes to an increase in the open circuit voltage.

Furthermore, by recrystallizing polycrystalline silicon thin film 4 through a melting and recrystallization method using a portion of the spherical metallurgical silicon as a seed, the crystal grain size is increased, and the grain boundary, which are the centers of carrier recombination, are reduced. This results in an increased life time for the minority of carriers. This and the effect of confining the carrier and light as described above effect together to increase the open circuit voltage and the short circuit current. The photoelectric conversion efficiency is thereby increased.

For core 1, because metallurgical silicon which has good electrical and thermal conductivity is used, there is little resistance loss in the internal current which flows through the electricity generating layer, and the temperature increase is kept low. Furthermore, because core 1 has a similar thermal expansion coefficient as the electricity generating silicon, there is no deteriorating effect on the photoelectrical properties due to thermal stress. Because it is spherical, it is superior to planar solar cells in terms of mechanical strength.

Because spherical solar cell SS is spherical, there is hardly any directionality to light, and the light-receiving angle is wide. By the absorption of direct light from its perimeter, and due to the absorption of reflective light and scattered light, the degree of usage of light is improved over the planar solar cells. In addition, sheet or panel solar modules which are a high density aggregate of a plurality of spherical solar cells SS are easily assembled. Furthermore, the titanium dioxide film ($TiO_2$) of surface protective film 10 which covers the surface not only acts as an anti-reflective film, but it also has photocatalytic function. As a protective film, it has a high hardness and is not easily damaged. It has excellent anti-corrosion property. Spherical solar cell SS can be used as a solar cell power source by connecting it directly and having it receive sunlight, or it can be used for conducting electrolysis by sunlight by immersing it in electrolyte solution.

In the spherical solar cell SS of the present invention, metallurgical silicon, which is inexpensive and abundant, is used for core 1. A high quality thin film silicon crystal layer, which uses a high purity monosilane ($SH_4$), is deposited on this surface, and a pn junction, which generates photovoltage, is formed. Not only is the cost of silicon raw material reduced, the power usage in manufacturing is substantially reduced because high purity polycrystals or monocrystals do not need to be used. The energy payback time of the solar cell is significantly reduced. When comparing spherical solar cell SS of the present invention with a solar cell constructed without core 1 and which uses high quality silicon semiconductor throughout, the usage amount of high purity silicon per unit of light receiving area is reduced, and the cost of raw materials is reduced by constructing core 1 with a metallurgical silicon of low purity and by having a thin film of high purity silicon as the electricity generating layer. In particular, when a large diameter spherical solar cell SS is desirable, the advantages of this construction are clearly demonstrated.

In spherical solar cell SS, solder plating can be conducted on top of electrodes 12a, 12b as needed so that a plurality of spherical solar cells SS can be serially connected to each other. When using for photolysis, depending on the object of the electrode reaction, an appropriate electrode material which has reaction product selectivity can be used to cover the surfaces of each of anode electrode 12a and cathode electrode 12b. For example, by using a cathode electrode modified with a metal oxide which is mainly copper, the H+ generated through hydrolysis and $CO_2$ supplied to the same electrolyte solution chamber can be made to selectively generate $CH_4$ by an electrochemical reaction at the same electrode interface.

A plurality of spherical solar cells SS can be serially aligned, and the electrodes can be connected in series in order to construct a solar cell array. A plurality of solar cell arrays can be aligned in parallel (in other words, a plurality of solar cells SS are placed in a matrix), and a solar cell sheet can be constructed. Solar cells SS can be arranged in a high density, and a solar cell with a high degree of light usage can be easily assembled.

As described for the fifth step, the method of recrystallization of p type polycrystalline silicon thin film into p type recrystallization silicon layer 4a has numerous advantages in the manufacturing process of spherical crystals. This is a method, wherein: the spherical body is levitated by electromagnetic force; it is heated by a high frequency induced current; it is allowed to cool while falling. No container is needed when melting the sample. It is particularly favorable for the growth of a uniform crystal layer on the sphere surface. With this method, when manufacturing a spherical semiconductor device, there is no contact with supporting objects in the process of diffusion of impurities, in the process of creating films through the flow of gas in CVD, or in the process of etching. As a result, the method can be used for the formation of uniform films and pn junctions and for the removal of films from the surface of the spherical body.

Furthermore, because it is handled in a levitated state, it can be heated to high temperatures without using a container. Thermal stress and thermal distortions in the interior of the spherical crystal due to the container or the like are not generated. In addition, the invasion of undesirable impurities does not occur. Furthermore, even if heating by high frequency induced current is not necessary, metals or insulating materials can be spattered or vapor deposited, or etching can be conducted, all while the spherical body is levitated by electromagnetic force or static electrical force. It is extremely advantageous in the manufacturing process for the spherical semiconductor device.

Next, an example, wherein parts of spherical solar cell SS described above is modified, will be explained.

In the above embodiment, metallurgical silicon is used as the material for core 1, but core 1 can be constructed from an inexpensive, solar cell-grade, polycrystalline or monocrystalline silicon, which is of lower quality than the silicon semiconductor used in integrated circuits or the like. This results in further improvements in the crystal properties of the electricity generating layer and in the carrier lifetime. A solar cell with an even higher photoelectric conversion efficiency is realized. Furthermore, the silicon of core 1 can be left as is, and instead of the electricity generating layer silicon (4a, 7), a thin film of a compound crystal such as Ge—Si, GaAs, InP or the like can be used. This will improve the photoelectric conversion property of the spherical solar cell.

Furthermore, a spherical solar cell can be constructed by using a germanium core instead of a spherical silicon core 1 and a thin film of GaAs or InP instead of the silicon electricity generating layer. Furthermore, electricity generating layer can be formed from the same semiconductor as the spherical core 1, or it can be a compound crystal semiconductor which includes this component. If this is the situation, it is preferable to use a lower quality, less expensive semiconductor for core 1. Regardless, by realizing the construction, wherein the electricity generating layer is a thin film and light and carriers can be confined, an optimization is achieved between cost and photoelectric conversion efficiency or even improving the photoelectric conversion efficiency. When using a core of sapphire (alpha-$Al_2O_3$) or magnesia-spinel (MgO—$Al_2O_2$), this core is suitable because it can be the seed or nucleus for crystal growth at the time of semiconductor thin film formation or during melting and recrystallization. It can also be used for integrated circuits of SOI (semiconductor on insulator) construction.

Next, a spherical semiconductor manufacturing device 101 which is used for the formation of spherical silicon core 1 and the electricity generating layer will be described. For the description below, the manufacture of spherical core 1 of metallurgical silicon will be described as an example.

Referring to FIG. 12, spherical crystal manufacturing device 101 comprises: a vertical drop tube 110 which has a diameter of 5–10 cm and a height of approximately 14 m; an electromagnetic levitation heating equipment 112 which is placed on the outside of the upper part of drop tube 110; an infrared heater 113 which is an after heater; a material supply device 111 which supplies raw material 1a which is the material for core 1 one at a time; a silicon oil chamber 115 which is housed in a housing area 114 which is continuous with the lower end of drop tube 110; a vacuum pump 116 which suctions air from inside drop tube 110; a gas supply device 117; a pipe system and valves; high speed cameras 118a–118c; a control unit 120 which controls these apparatus. Furthermore, floors 1–5 of the factory are depicted as floors 103a–103e.

Material supply device 111 comprises: a supplier 121; a parts feeder 122 which stores several granular material 1a and which supplies them one at a time. Parts feeder 122 has a function of pre-heating solid material 1a and a function for evacuation of atmosphere. A case 123 of a supplier 121 is connected to vacuum pump 116 by a suction pipe 125 which has an electromagnetic switch valve 124. A receiving apparatus 126 is connected to parts feeder 122 by a pathway 128 which has an electromagnetic shutter 127. There is an electromagnetic shutter 130 at an exit pathway 129 of receiving apparatus 126. Vacuum from inside case 123 is introduced via a plurality of small holes to receiving apparatus 126. During the operation of manufacturing device 101, electromagnetic valve 124 is opened, and there is a vacuum inside supplier 121. When supplying raw material 1a from parts feeder 122, electromagnetic shutter 130 is closed. Electromagnetic shutter 127 is opened, and after material 1a is supplied to the inside of receiving apparatus 126, electromagnetic shutter 127 is closed. There are electromagnetic valves 136–138 on suction pipes 133–135 which are connected to vacuum pump 116. In order to allow inert gases or oxidizing gases to flow inside drop tube 110 as needed, there are a gas supply device 117, a gas supply pipe 139, branching pipes 139a, 139b, a gas discharge pipe 141, and electromagnetic valves 140, 142. However, if a vacuum is to be maintained inside drop tube 110, gas supply device 117 is stopped, and electromagnetic valves 140, 142 are closed.

Electromagnetic levitation heating equipment 112 is constructed from an upper coil, a lower coil, and a high frequency current generating device 119, and the like. An upward force of magnetic line is generated by the upper coil. A downward force of magnetic line is generated by the lower coil. An induced current is generated in material 1a by the forces of magnetic lines which change at a high frequency. When material 1a is at a central position between the upper and lower coils, the force of the magnetic lines acting on the induced current are balanced between the upward force and downward force. Material 1a is maintained in a levitated state. Material 1a is heated by the heat generating action of the induced current. When material 1a becomes molten material 1b, the high frequency current is shut down. Molten material 1b begins a free-fall. With this free-fall, molten material 1b becomes spherical by the action of surface tension under a very small gravitational force of $10^{-5}$ G.

The purpose of infrared heater 113 is for heating only the surface of molten material 1b by a small amount. Infrared heater 113 is placed as a ring around the outside of drop tube 110. Infrared heater 113 is placed at a certain distance away from electromagnetic levitation heating equipment 112. Infrared heater 113 comprises a cylindrical heater body which is made of an infrared radiation ceramics. By controlling the current which is supplied to this heater body, the heating function can be controlled precisely. Because molten material 1b rotates while free falling, only the surface of molten material 1b is heated evenly by infrared heater 113.

Next, the operations will be described where manufacturing device 101 is used to make spherical crystal 1 by supplying material 1a of metallurgical silicon. In the first preparation stage, electromagnetic valves 124, 136, 137, 138 are opened. Vacuum pump 116 is operated, and specified vacuum conditions are created inside drop tube 110. A single material 1a is stored in receiving apparatus 126. There is a pre-determined current flowing through infrared heater 113. Next, current is run through electromagnetic levitation heating equipment 112. Electromagnetic shutter 130 is opened, and solid material 1a free-falls. Material 1a is heated by electromagnetic levitation heating equipment 112 for a specified short amount of time. Material 1a becomes molten material 1b. Referring to FIG. 13(a), the temperature distribution of molten material 1b at this time is such that the temperature is roughly the same in both the interior and on the surface of molten material 1b.

Next, the current to electromagnetic levitation heating equipment 112 is shut off. Molten material 1b begins a free fall in the vacuum of drop tube 110. Molten material 1b initially falls with a low speed. In the short time it takes to fall to the level of the upper end of infrared heater 113, there is radiative cooling, and there is heat release. Because there is heat release from the surface of molten material 1b, the surface of molten material 1b is cooler than the interior (refer to temperature distribution in FIG. 13(b)). Because molten material 1b is under microgravity conditions, after the commencement of the free-fall, molten material 1b becomes spherical by the action of surface tension.

Next, during the free fall of the molten material 1b through the interior of infrared heater 113, only the surface is heated. Referring to FIG. 13(c), the surface of molten material 1b is warmer than the interior. Next, while it is free falling towards the bottom of infrared heater 113, molten material 1b releases heat through radiative cooling. By the action of surface tension, molten material 1b solidifies to a truly spherical core 1.

After passing through infrared heater 113, radiative cooling progresses. Referring to FIG. 13(d), the temperature distribution of molten material 1b when the temperature has dropped to near the solidifying point $T_0$ is indicated by the solid line or the dotted line. Because solidification begins with these conditions, solidification begins from the interior and from the surface of molten material 1b. As a result, even if there is volume expansion during solidification, there are no projections formed on the surface of core 1. The inner mechanical stress of core 1 also becomes very small.

Afterwards, core 1, which has finished solidification at around the middle level of drop tube 110, drops into silicon oil inside silicon oil chamber 115. They are stored there and are cooled completely.

Spherical core 1 which is truly spherical and which is without any projections can be manufactured in the above manner. Furthermore, because the surface of molten material 1b does not solidify before the inside does, any air bubbles on the surface of material 1a does not mix in spherical core 1. Because molten material 1b solidifies to core 1 under microgravity conditions, core 1 with an uniform constitutional distribution with no influence from heat convection, buoyancy, sedimentation is achieved. If a high quality semiconductor material is to be used for material 1a, it is possible to manufacture a truly spherical crystal of a monocrystal or polycrystal of this semiconductor. In the manufacture of spherical solar cell SS of the previous embodiment, all of or a portion of the processing for the formation of semiconductor thin film is preferably conducted while levitating the object with spherical crystal manufacturing device 101 or a spherical crystal device which uses a static electricity levitation means. Furthermore, all of or a portion of the processing after the semiconductor thin film crystal formation, including pn junction formation, electrode formation, surface protective film formation, and the like is preferably conducted while levitating the object with spherical crystal manufacturing device 101 or a spherical crystal device which uses a static electricity levitation means.

Figure 14:
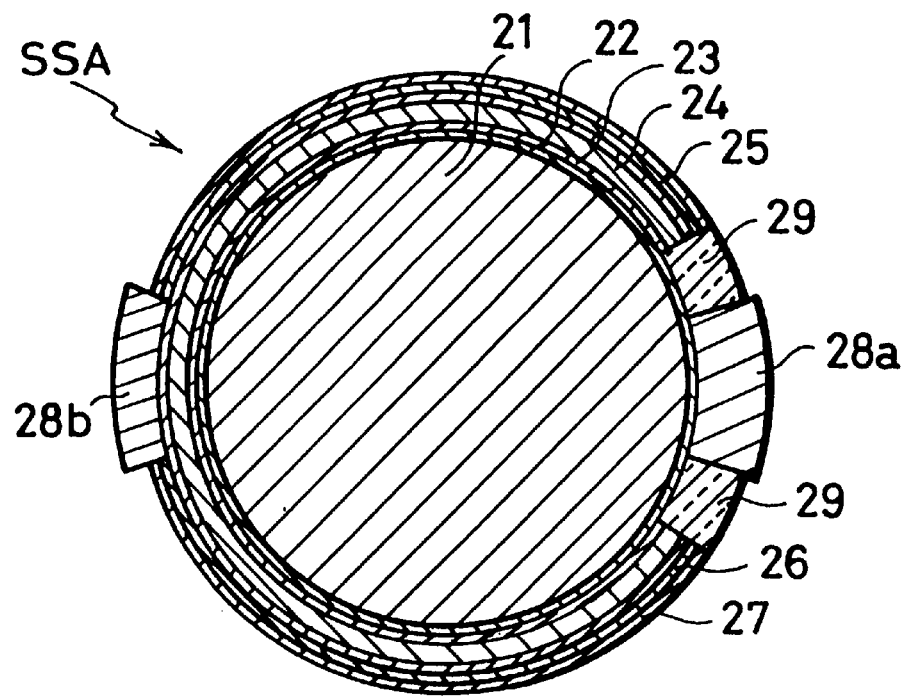
Referring to FIG. 14, there is shown a cross-section of a spherical solar cell of embodiment 2.

Embodiment 2 (Refer to FIG. 14)

Next, a manufacture method and the construction of a spherical solar cell comprising a metal core is described. Referring to FIG. 14, there is shown an expanded cross-section of spherical solar cell SSA which is formed by forming a thin film of silicon solar cell on the surface of a spherical metal core 21.

Core 21 is constructed from an iron nickel alloy (Fe 58, Ni 42) which has a similar thermal expansion coefficient as the thermal expansion coefficient of silicon. Spherical core 21 is manufactured using spherical crystal manufacturing device 101. An aluminum coating 22 is vapor deposited onto the surface of core 21 at a thickness of around 100 nm. On the surface of aluminum coating 22, an amorphous silicon film (a-Si film) of a thickness of around 200 nm is formed as a pre-disposition film. In this case, monosilane is being decomposed as it is being deposited by plasma CVD method. A non-doped amorphous silicon film is formed. Next, this is heated for 1 hour at 500 degrees C. with a focusing lamp (anneal processing). The hydrogen in the a-Si film is eliminated, and by the eutectic crystallization reaction of Al and Si, a crystal nucleus is generated.

Next, this is heated for about 5 minutes at 700 degrees C., and a P+ polycrystalline silicon layer 23 doped with aluminum is grown. Next, non-doped amorphous silicon (a-Si) is deposited at a thickness of 3–4 micrometers on the surface of P+ polycrystalline silicon layer 23 by the plasma CVD method. Anneal processing is conducted at around 600 degrees C. Using the foundation of P+ polycrystalline silicon layer 23 as the seed, a polycrystalline silicon layer 24 is formed.

Next, on the surface of polycrystalline silicon layer 24, while decomposing monosilane ($SiH_4$), which has phosphine ($PH_3$) added, by plasma CVD method, a-Si of approximate thickness 100 nm is deposited. This is annealed at around 600 degrees C., and a n+ polycrystalline silicon layer 25 is formed. For generation of photovoltage, an np junction is formed.

Next, on the surface of the spherical body, a passivation film 26 of $SiO_2$ film of thickness 0.2 micrometer is formed. On its surface, a surface protective film 27 of a $TiO_2$ film of thickness 1–2 micrometer is formed. Next, in order to have electrodes which contact aluminum layer 22 and n+ polycrystalline silicon layer 25, circular openings which reach the surface of aluminum layer 22 and n+ polycrystalline silicon layer 25 are formed at two positions which are symmetric with respect to the center of core 21. Referring to FIG. 14, anode electrode 28a and cathode electrode 28b are formed by vapor deposition. A junction protective film 29, which is formed by burning on a low melting point glass, covers the portion of the np junction which has been exposed to the surface due to the opening.

As compared with spherical solar cell SS, spherical solar cell SSA is inexpensive, and processing is easy because core 21 is a metal. It also has excellent electrical conductivity and thermal conductivity, and there is little resistance loss with respect to the current which flows through the electricity generating portion, and the cooling effect is heightened. Furthermore, because core 21 is a magnetic substance, an external magnetic force can be applied in order to levitate, to anchor, or to move, and thus it is advantageous in terms of handling. Furthermore, because raw materials and energy costs can be reduced compared with the manufacture of bulk type cells of the prior art, there is advantages in terms of manufacturing costs. The aluminum coating described above can be eliminated, and other semiconductor materials used in known solar cells, such as CdTe or CuInSe2 or the like, can be used to construct the electricity generating layer.

Figure 15:
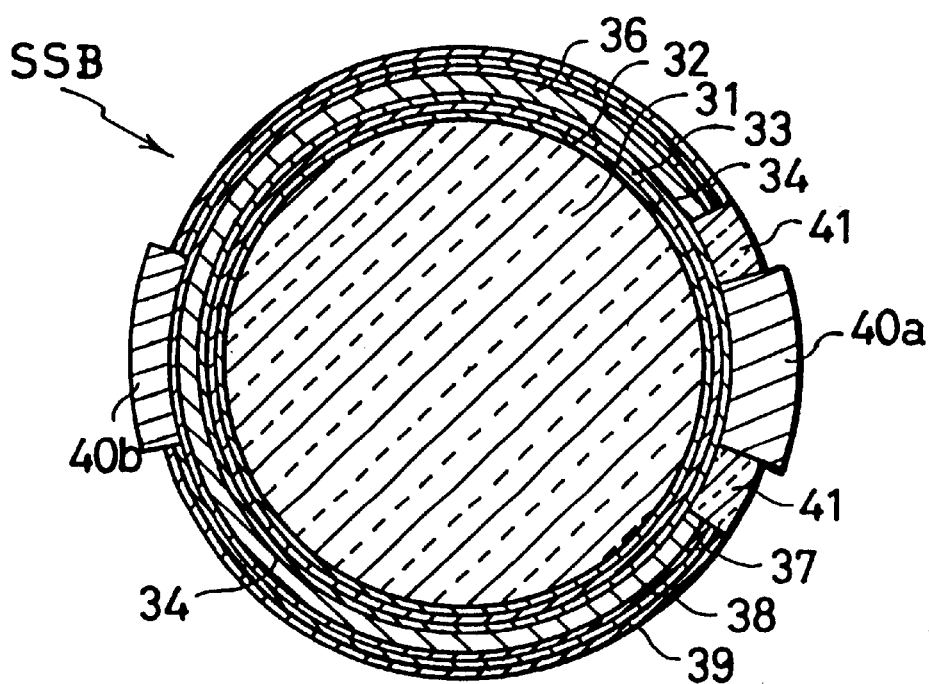
Referring to FIG. 15, there is shown a cross-section of a spherical solar cell of embodiment 3.

Embodiment 3 (Refer to FIG. 15)

The manufacturing method and construction of a spherical solar cell comprising a core made of insulating material is described. By constructing the core of a spherical solar cell or other spherical semiconductor device out of insulating material, not only does it have various characteristics due to its spherical shape, but it also becomes possible to construct a spherical semiconductor device which has, on its surface, one or a plurality of solar cells or other various devices (for example, a photocatalytic device, a photo detecting device, a light emitting device, a transistor, an integrated circuit, or the like) which are separated electronically on the surface of the insulating material core. Depending on the need, these devices can be used by connecting them to the sphere surface. This type of spherical semiconductor device, including the above embodiments solar cells SS and SSA, can be connected in the same manner as other similar spherical semiconductor devices or as in the ball bump method between wiring substrate of the prior art. Referring to FIG. 15, there is shown a spherical solar cell SSB, comprising: a spherical core 31 of fused silica (insulating material) which has a similar thermal expansion coefficient as the thermal expansion coefficient of silicon; and a thin film silicon solar cell over its entire surface. First, spherical core 31 made of fused silica is manufactured by a polishing processing method similar to making of a lens. On the surface of core 31, irregularities with an elevation difference of 1 micrometer similar to the situation with spherical solar SS are formed by sandblasting or the like. Next, on the surface of the spherical body, a silicon nitride film 32 ($Si_3N_4$ film) of thickness 0.3 micrometer and a silicon dioxide film 33 ($SiO_2$ film) are sequentially formed. Next, on the surface of this spherical body, an electrically conductive film 34 is vapor deposited. Conductive film 34 has a two layer construction, comprising a chrome coating of thickness 0.3 micrometer and an aluminum coating of thickness 10nm. Silicon nitride film 32 prevents the diffusion of impurities from core 31. Silicon dioxide film 33 acts as a foundation for conductive film 34.

As in embodiment 2, on the surface of conductive film, by depositing monosilane while decomposing by the CVD method, a non-doped amorphous silicon thin film of thickness approximately 20 nm is formed as the predisposition film. This amorphous silicon thin film is annealed by heating to approximately 600 degrees C. with a focusing lamp, and it is converted to a P+ type polycrystalline silicon film. On top of the P+ type polycrystalline silicon film, non-doped amorphous silicon (a-Si) is deposited at a thickness of 3–4 micrometers by the plasma CVD method. Anneal processing is conducted at around 600 degrees C. Using the P+ polycrystalline silicon layer as the seed, a p type polycrystalline silicon layer 36 is grown.

Next, on the surface of p type polycrystalline silicon layer 36, while decomposing monosilane ($SiH_4$) to which phosphine ($PH_3$) is mixed by plasma CVD method, a-Si of approximate thickness 100 nm is deposited. This is annealed at around 600 degrees C., and a n+ polycrystalline silicon layer 37 is formed. For generation of photovoltage, a p+pn+ junction is formed. Similar to embodiment 2, a passivation film 38, surface protective film 39, anode electrode 40a, cathode electrode 40b, junction protective film 41a reformed, and a spherical solar cell SSB, comprising a spherical thin film silicon solar cell, is manufactured.

We have described spherical solar cells SS, SSA, SSB as embodiments of the present invention, but the present invention can be used in other spherical semiconductor devices such as a spherical photodiode as a spherical semiconductor light detecting device, a spherical phototransistor, a spherical light emitting diode, and the like. In these cases, the electricity generating layer becomes the light receiving layer, light emitting layer, and they can be manufactured with appropriate known materials and by appropriate known methods.

Figure 16:
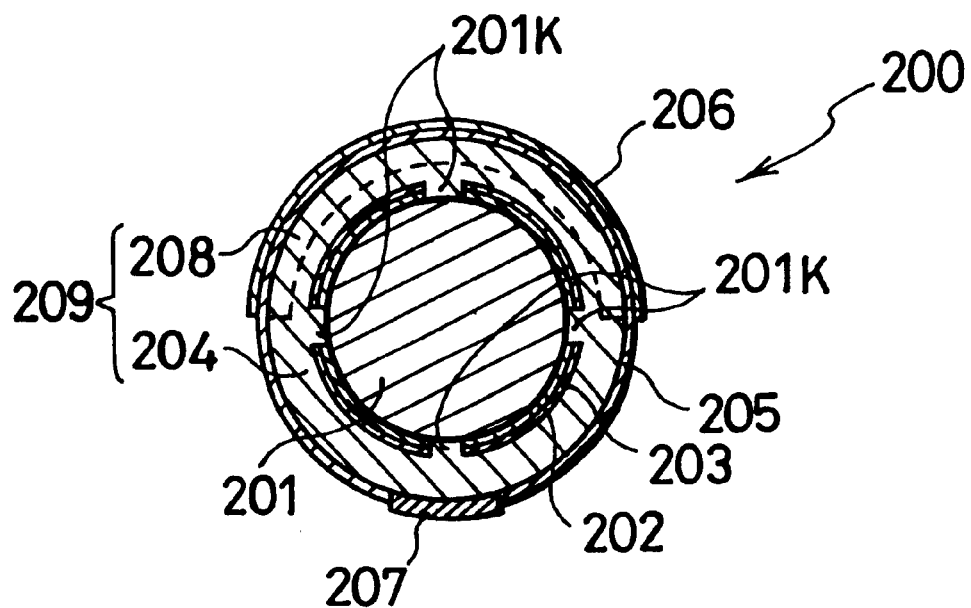
Referring to FIG. 16, there is shown a cross-section of a spherical photocatalytic element of embodiment 4.

Embodiment 4 (Refer to FIG. 16)

Next, the construction of a spherical photocatalytic element in which metallurgical silicon core is used and which has a built-in MIS construction is described. Referring to FIG. 16, there is shown a spherical photocatalytic element 200, comprising: a spherical core 201 of metallurgical silicon with a diameter of approximately 1.5 mm; a silicon nitride film 202 on its surface (thickness 0.25–0.35 micrometer); a silicon dioxide film 203 on its surface (thickness 0.3–0.4 micrometer); an n-type silicon film 204 on its surface (thickness 5–10 micrometers); a silicon dioxide coating 205 (thickness 1.5–3.0 nm); a anode electrode coating 206, comprising a Pt or Cr coating (5–8 nm); acathode electrode 207 of Ti or Ni; and the like. Spherical photocatalytic element 200 forms a MIS construction. Furthermore, in order to use a portion of core 201 as a crystal seed when crystallizing n type silicon film 204, a plurality of small openings 201K are formed on films 202, 203.

With this MIS construction, bending of the energy band similar to that of a pn junction is created on the inner side of silicon dioxide coating 205. A photovoltage generating area 209 which includes an energy band bending layer 208 is formed near the surface. A plurality of spherical photocatalytic elements 200 can be placed in an electrolyte solution, and they can be used in electrolysis of the electrolyte solution. Instead of metallurgical silicon, insulating material or metal material can be used for core 201.

Figure 17:
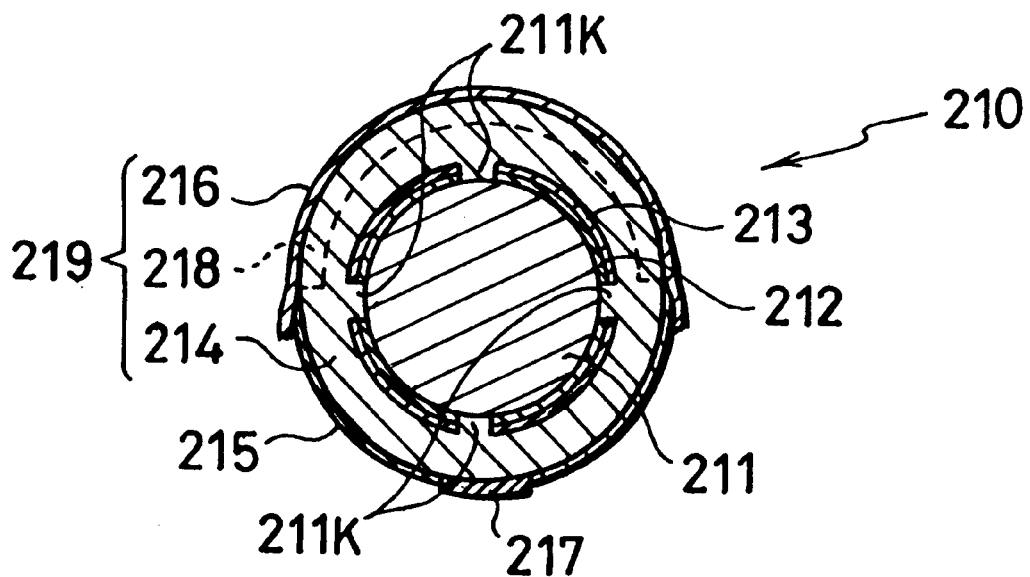
Referring to FIG. 17, there is shown a cross-section of a spherical photocatalytic element of embodiment 5.

Embodiment 5 (Refer to FIG. 17)

Next, the construction of a spherical photocatalytic element in which a metallurgical silicon core is used and which has a with a built-in Schottky barrier construction is described. Referring to FIG. 17, there is shown a spherical photocatalytic element 210, comprising: a spherical core 211 of metallurgical silicon with a diameter of approximately 1.5 mm; a silicon nitride film 212 on its surface (thickness 0.25–0.35 micrometer); a silicon dioxide film 213 on its surface (thickness 0.3–0.4 micrometer); an n-type silicon film 214 on its surface (thickness 5–10 micrometers); an insulating coating 215 (surface protective film) of silicon dioxide with a thickness of 0.3–0.7 micrometers; a anode electrode coating 216 of Pt or Cr with a thickness of 5–8 nm; a cathode electrode 207 of Ti or Ni; and the like. Spherical photocatalytic element 210 forms a Schottky barrier construction. Furthermore, in order to use a portion of core 211 as a crystal seed when crystallizing n type silicon film 214, a plurality of small openings 211K are formed on films 212, 213. With this Schottky barrier construction, bending of the energy band similar to that of a pn junction is created on the inner side of anode electrode coating 216. A photovoltage generating area 219 which includes an energy band bending layer 218 is formed near the surface of n type silicon film 214. A plurality of spherical photocatalytic elements 210 can be placed in an electrolyte solution, and they can be used in electrolysis of the electrolyte solution. Instead of metallurgical silicon, insulating material or metal material can be used for core 241.

Figure 18:
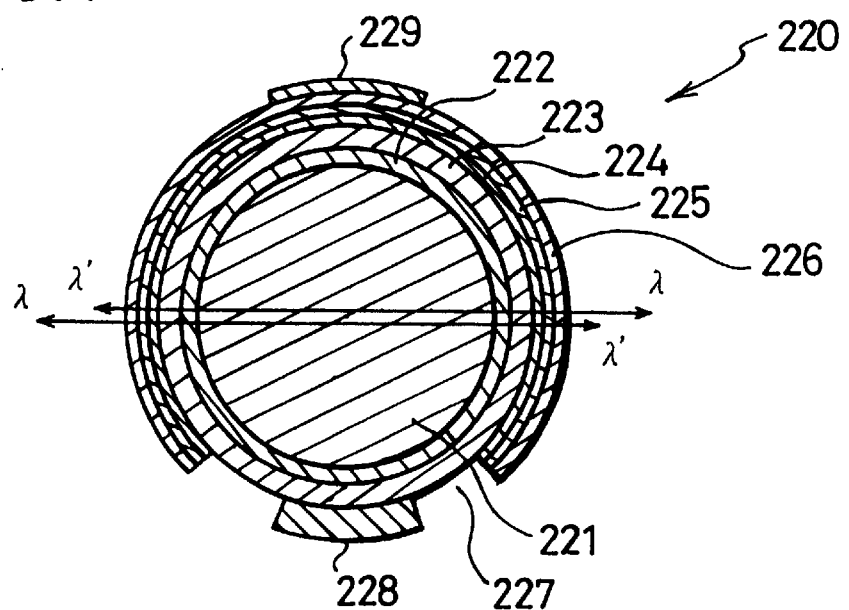
Referring to FIG. 18, there is shown a cross-section of a spherical light emitting diode cell of embodiment 6.
Figure 19:
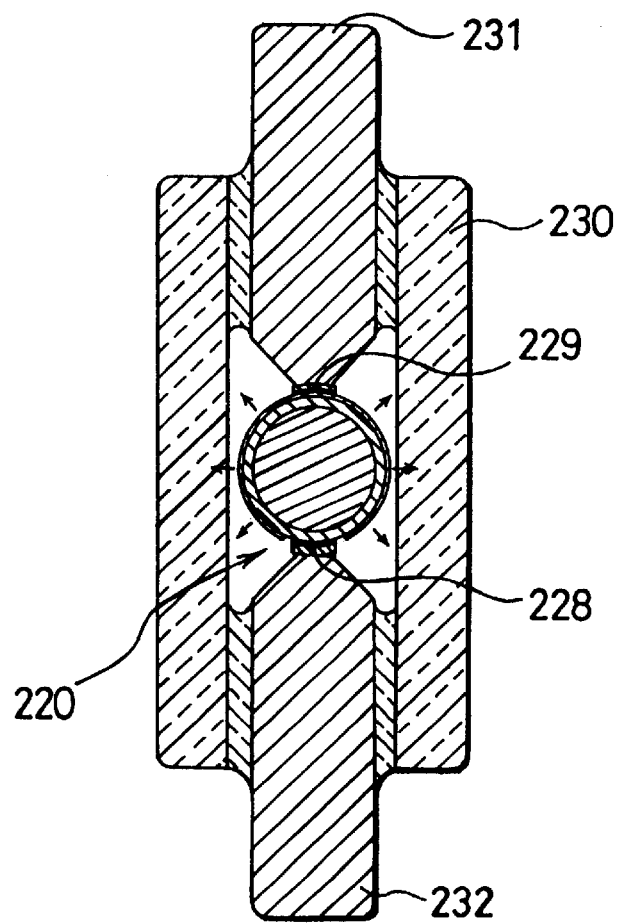
Referring to FIG. 19, there is shown a cross-section of a light emitting device which has a built-in spherical light emitting diode cell of FIG. 18.

Embodiment 6 (Refer to FIGS. 18, 19)

Next, the construction of a spherical light emitting element which has a sapphire (alpha-$Al_2O_3$) core is described. Referring to FIG. 18, there is shown an expanded view of a spherical light emitting element 220 which is a gallium nitride blue light emitting diode.

A spherical monocrystalline core 221 made of sapphire with a diameter of 1.5 mm is prepared. On the surface of core 221, the following layers are deposited sequentially by the known method of organic metal chemical vapor deposition (MOCVD method): a GaN buffer layer 222 (approximate thickness 30nm); an n type GaN layer 223 (approximate thickness 3000nm); an $In_{0.4}Ga_{0.6}N$ active layer 224 (approximate thickness 3nm); a p type $Al_{0.2}Ga_{0.8}N$ layer 225 (approximate thickness 400 nm); a p type GaN layer 226 (approximate thickness 500 nm). For this deposition, it is preferred to conduct the film formation of each layer continuously in a specified gas atmosphere while levitating spherical core 221 by a static electricity levitation heating equipment. This will result in a uniform film formation. This construction is a single quantum well construction and is specified so that it emits a visible blue light with a peak wavelength of 470 nm. The composition, film thickness, film constructions can be specified according to the objective.

Next, while masking the surface with a $Si_3N_4$ coating or the like, a window 227 of diameter of approximately 600 micrometers is opened through reactive ion etching by a chlorine gas/plasma until the surface of n type GaN layer 223 is exposed. In the center of window 227, a cathode electrode 228 of diameter 200 micrometers is created from a Ni/Au vapor deposition film. The mask of $Si_3N_4$ coating or the like is removed, and an anode electrode 229 of diameter 200 micrometers is formed as a Ti/Au vapor deposition film on the surface on the opposite side of cathode electrode 228. Anode electrode 229 contacts the surface of p type GaN layer 226.

Referring to FIG. 19, by housing blue light emitting diode 220 within a glass tube 230 and applying external voltage from an anode lead 231 to a cathode lead 232 and letting forward current to flow, diode 220 will emit blue light in all directions with a peak wavelength of 470 nm. Referring to FIG. 19, because the sapphire which constructs core 221 is transparent, light lambda' which is emitted from the opposite side is also radiated to the outside. Unlike the planar light emitting diodes of the prior art which are limited to one side, light is emitted from either surfaces, and the performance is dramatically improved, and the external light output efficiency of the inner light emission is doubled. If the distance between surfaces of the sphere which contains core 221 is set so that it becomes a resonator with respect to the wavelength of emitted light, it can be constructed to operate as a spherical blue light laser diode. Referring to FIG. 19, because the cell of blue light emitting diode 220 is spherical, an assembly method where there is insertion contact with a lead pin becomes possible. Connections with a thin wire becomes unnecessary, and the fact that a plurality of cells can be easily be made into an array by direct contact with each other is the same as with the spherical solar cell described previously.

Figure 20:
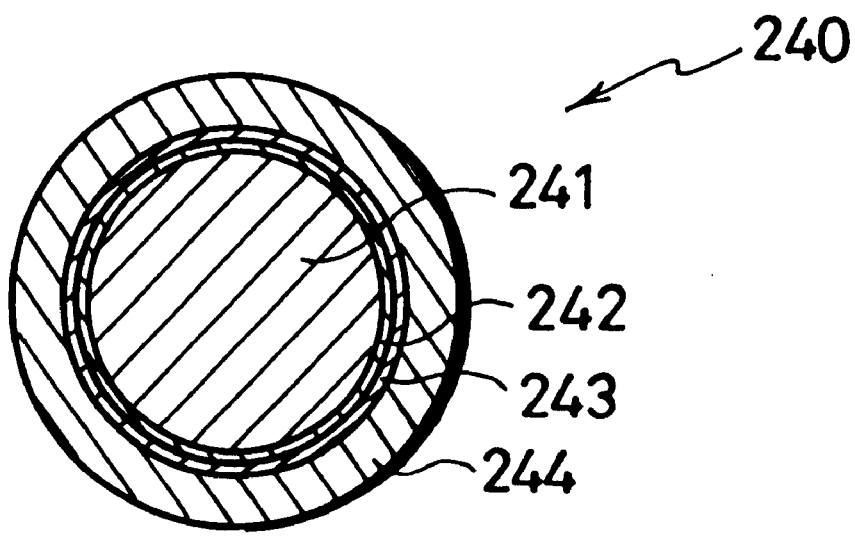
Referring to FIG. 20, there is shown a cross-section of a spherical semiconductor device material of embodiment 7.

Embodiment 7 (Refer to FIG. 20)

Next, an embodiment of a spherical semiconductor device material is described. Referring to FIG. 20, there is shown a spherical semiconductor device material 240, comprising: a spherical core 241; a silicon nitride film 242 on its surface (thickness 0.25–0.35 micrometer); a silicon dioxide film 243 on its surface (thickness 0.3–0.4 micrometer); and a semiconductor thin film layer 244 formed on its surface (thickness approximately 10 micrometers). Core 241 is constructed from one of the following materials: semiconductor (for example, metallurgical silicon or the like); insulating material (sapphire, quartz, or ceramic); metal materials (Fe—Ni alloy, Mo or W, or the like). Semiconductor thin film layer 244 is constructed from a semiconductor of a silicon monocrystal, silicon polycrystal, or other compound semiconductor such as SiGe or InP, or the like. It can be a single layer semiconductor film, or it can be a multi-layer semiconductor film. When recrystallyzing semiconductor thin film 244, silicon dioxide film 243 can be used as the seed for the crystal. Films 242, 243 can have similar irregularities as in FIG. 11, or the irregularities can be omitted.

Figure 21:
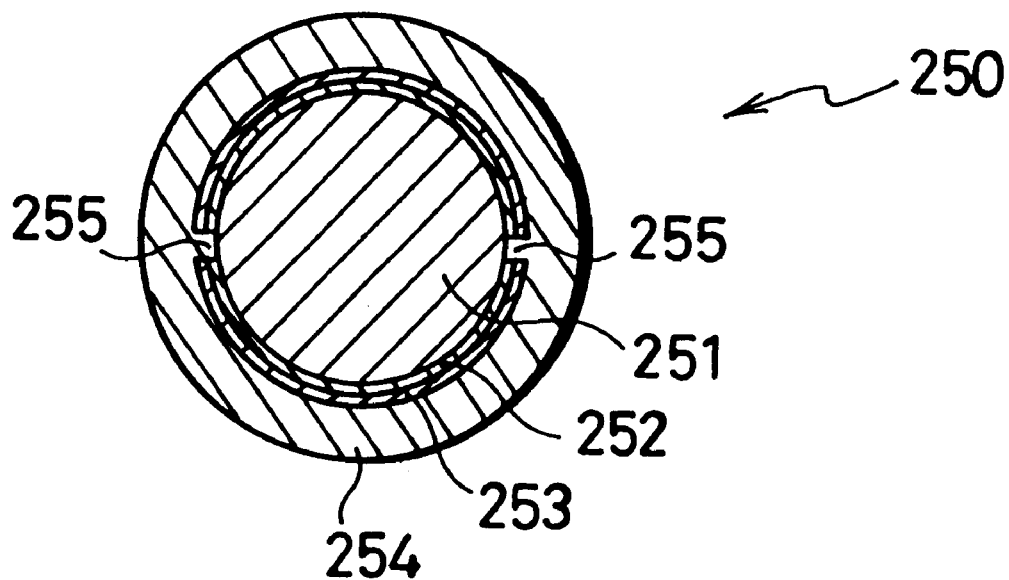
Referring to FIG. 21, there is shown a cross-section of a spherical semiconductor device material of embodiment 8.

Embodiment 8 (Refer to FIG. 21)

Next, an embodiment of a spherical semiconductor device material is described. Referring to FIG. 20, there is shown a spherical semiconductor device material 250, comprising: a spherical core 251; a silicon dioxide film 252 on its surface (thickness 0.3–0.4 micrometer); a silicon nitride film 253 on its surface (thickness 0.25–0.35 micrometer); and a semiconductor thin film layer 254 formed on its surface (thickness 5–10 micrometers). A plurality of small openings 255 are formed on the films 252, 253. Core 251 is constructed from a monocrystal semiconductor such as silicon or the like, or from a monocrystal insulating material such as sapphire or magnesia-spinel, or the like. Semiconductor thin film layer 254 is constructed from a semiconductor of a silicon monocrystal, silicon polycrystal, or other compound semiconductor such as SiGe or InP, or the like. It can be a single layer semiconductor film, or it can be a multi-layer semiconductor film. When recrystallyzing semiconductor thin film 254, a portion of core 251 through the plurality of openings 255 can be used as the seed for the crystal.

Spherical semiconductor device material 240, 250 of embodiments 7, 8 can be used as material for manufacturing various spherical light detecting elements, various spherical light emitting elements, various spherical transistors, various spherical diodes, and spherical integrated circuits of SOI constructions.

What is claimed is:

1. A spherical semiconductor device comprising:

a spherical core;

a semiconductor thin film layer at or near an outer surface of said core;

at least one pn junction formed on said semiconductor thin film layer; and first and second electrodes connected to first and second sides of said pn junction, wherein said first side is opposite said second side, such that an axis of said spherical core passes through both electrodes.

2. A spherical semiconductor device according to claim 1, wherein said core is a semiconductor material.

3. A spherical semiconductor device according to claim 2, wherein said semiconductor material is silicon.

4. A spherical semiconductor device according to claim 1, wherein said core is a metal material having substantially the same thermal expansion coefficient as a thermal expansion coefficient of said semiconductor thin film layer.

5. A spherical semiconductor device according to claim 1, wherein said core is an insulating material having substantially the same thermal expansion coefficient as a thermal expansion coefficient of said semiconductor thin film layer.

6. A spherical semiconductor device according to claim 1, wherein said pn junction has a photoelectric conversion function whereby said pn junction absorbs incident outside light to generate a photovoltage.

7. A spherical semiconductor device according to claim 6, further comprising a passivation film on at least one of an inner surface of said semiconductor thin film layer and an outer surface of said semiconductor thin film layer, at least at said pn junction where said photovoltage is generated.

8. A spherical semiconductor device according to claim 6, wherein said semiconductor device is one of a solar cell and a photo detecting element.

9. A spherical semiconductor device according to claim 1, wherein:

said pn junction has an electrophoto conversion function whereby current supplied from said first and second electrodes is converted to light; and said light is radiated to an exterior of said semiconductor device.

10. A spherical semiconductor device according to claim 1 further comprising:

a transparent insulating film on an outer surface of said semiconductor device; and said outer surface not including said first and second electrodes.

11. A spherical semiconductor device according to claim 10, wherein said transparent insulating film is a titanium dioxide film having a photocatalytic function.

12. A spherical semiconductor device according to claim 10 wherein said transparent insulating film includes means for preventing reflection of light out of said semiconductor device.

13. A spherical semiconductor device according to claim 1, further comprising:

a reflective surface between said semiconductor thin film layer and said core;

said reflective surface having minute irregularities, whereby either light passing through said semiconductor thin film layer or light generated at said semiconductor thin film layer is reflected.

14. A spherical semiconductor device according to claim 1, wherein:

said core and said semiconductor thin film layer are formed from substantially the same material; and said core formed from a material of a lower quality than said semiconductor film layer.

15. A spherical semiconductor device according to claim 1, wherein said semiconductor thin film layer is a silicon semiconductor.

16. A spherical semiconductor device according to claim 15, wherein said core contains metallurgical silicon.

17. A spherical semiconductor device according to claim 1, further comprising:

a photocatalytic coating on a surface of at least one said first and second electrodes; and said photocatalytic coating being exposed to an outermost surface of said semiconductor device.

18. A method for manufacturing a spherical semiconductor device, comprising:

constructing a spherical core using a core material selected from the group consisting of semiconductor materials, insulating materials, and metal materials;

forming a semiconductor thin film layer at or near an outer surface of said core;

forming at least one pn junction within said semiconductor thin film layer; and connecting first and second electrodes to first and second sides of said pn junction, wherein said first side is opposite said second side, such that an axis of said spherical core passes through both electrodes.

19. A method of manufacturing a spherical semiconductor device according to claim 18, further comprising:

heating said core material into a melt while being levitated by a levitating means; and dropping said melt through a drop tube, whereby said melt is solidified into a spherical core.

20. A method of manufacturing a spherical semiconductor device according to claim 18, further comprising:

reheating said core material and said semiconductor thin film layer to form a melt prior to forming said pn junction; and solidifying said melt by dropping said melt through a drop tube.

21. A method of manufacturing a spherical semiconductor device according to claim 20, wherein:
   said core material is a semiconductor material; and
   said solidifying of said melt crystallizes said semiconductor thin film layer, whereby said core material is a seed for crystal growth.

22. A method of manufacturing a spherical semiconductor device according to claim 18, further comprising:
   coating said semiconductor thin film layer with an inorganic, heat-resistant, insulating coating material prior to forming said at least one pn junction;
   reheating said core material and said semiconductor thin film layer to form a melt, whereby said inorganic, heat-resistant, insulating coating material remains solid; and
   solidifying said melt by dropping said melt through a drop tube.

23. A method of manufacturing a spherical semiconductor device according to claim 18, further comprising depositing an insulating film of titanium dioxide on an outer surface of said spherical semiconductor device.

24. A method of manufacturing a spherical semiconductor device according to claim 18, wherein at least a portion of said forming of said semiconductor thin film layer is conducted while said spherical core is suspended by an at least one of electromagnetic and static electricity levitation means.

25. A method of manufacturing a spherical semiconductor device according to claim 18, said spherical core is suspended by at least one of electromagnetic and static electricity levitation means for at least one step following formation of said semiconductor thin film layer.

* * * * *